US010224236B2

(12) United States Patent
Choi et al.

(10) Patent No.: US 10,224,236 B2
(45) Date of Patent: Mar. 5, 2019

(54) FORMING AIR GAP

(71) Applicant: GLOBALFOUNDRIES INC., Grand Cayman (KY)

(72) Inventors: Samuel S. Choi, Fishkill, NY (US); Ronald G. Filippi, Wappingers Falls, NY (US); Elbert E. Huang, Carmel, NY (US); Naftali E. Lustig, Croton on Hudson, NY (US); Griselda Bonilla, Hopewell Junction, NY (US); Andrew H. Simon, Fishkill, NY (US)

(73) Assignee: GLOBALFOUNDRIES INC., Grand Cayman, KY (US)

( * ) Notice: Subject to any disclaimer, the term of this patent is extended or adjusted under 35 U.S.C. 154(b) by 0 days.

(21) Appl. No.: 15/813,399

(22) Filed: Nov. 15, 2017

(65) Prior Publication Data

US 2018/0076082 A1 Mar. 15, 2018

Related U.S. Application Data

(62) Division of application No. 15/186,640, filed on Jun. 20, 2016, now abandoned.

(51) Int. Cl.
*H01L 21/768* (2006.01)
*H01L 21/311* (2006.01)
(Continued)

(52) U.S. Cl.
CPC ...... *H01L 21/7682* (2013.01); *H01L 21/0217* (2013.01); *H01L 21/31111* (2013.01);
(Continued)

(58) Field of Classification Search
CPC ......... H01L 21/76835; H01L 21/76829; H01L 21/7682
See application file for complete search history.

(56) References Cited

U.S. PATENT DOCUMENTS 7,037,851 B2  5/2006  Gueneau de Mussy et al.
7,078,352 B2  7/2006  Beyer et al.
(Continued)

OTHER PUBLICATIONS

Gosset et al., Multi-Level Cu Interconnects Integration and Characterization with Air Gap as Ultra-Low K Material Formed using a Hybrid Sacrificial Oxide/Polymer Stack.
(Continued)

*Primary Examiner* — A. Sefer
(74) *Attorney, Agent, or Firm* — Anthony Canale; Hoffman Warnick LLC

(57) ABSTRACT

A method of forming an air gap for a semiconductor device and the device formed are disclosed. The method may include forming an air gap mask layer over a dielectric interconnect layer, the dielectric interconnect layer including a dielectric layer having a conductive interconnect therein and a cap layer over the dielectric layer; patterning the air gap mask layer using extreme ultraviolet (EUV) light and etching to form an air gap mask including an opening in the cap layer exposing a portion of the dielectric layer of the dielectric interconnect layer adjacent to the conductive interconnect; removing the air gap mask; etching an air gap space adjacent to the conductive interconnect within the dielectric layer of the dielectric interconnect layer using the opening in the cap layer; and forming an air gap in the dielectric interconnect layer by depositing an air gap capping layer to seal the air gap space.

18 Claims, 4 Drawing Sheets

(51) Int. Cl.
    *H01L 23/528* (2006.01)
    *H01L 21/02* (2006.01)
    *H01L 23/532* (2006.01)

(52) U.S. Cl.
    CPC ...... *H01L 21/31144* (2013.01); *H01L 23/528* (2013.01); *H01L 23/5329* (2013.01)

(56) References Cited

U.S. PATENT DOCUMENTS

| | | |
|---|---|---|
| 7,309,649 B2 | 12/2007 | Colburn et al. |
| 7,531,444 B2 | 5/2009 | Dimitrakopoulos et al. |
| 7,943,480 B2 | 5/2011 | Edelstein et al. |
| 7,947,907 B2 | 5/2011 | Colburn et al. |
| 8,227,336 B2 | 7/2012 | Edelstein et al. |
| 8,900,988 B2 | 12/2014 | Lin et al. |
| 2006/0022345 A1 | 2/2006 | Schindler et al. |
| 2006/0105558 A1 | 5/2006 | Chuang et al. |
| 2008/0284039 A1 | 11/2008 | Colburn et al. |
| 2009/0072409 A1 | 3/2009 | Nitta et al. |
| 2009/0075470 A1 | 3/2009 | Nitta et al. |
| 2009/0200636 A1* | 8/2009 | Edelstein ............ H01L 21/0273 257/522 |
| 2010/0301489 A1 | 12/2010 | Seidel et al. |
| 2010/0330799 A1 | 12/2010 | Hamanaka et al. |
| 2011/0108989 A1 | 5/2011 | Clevenger et al. |
| 2011/0163446 A1 | 7/2011 | Nitta et al. |
| 2012/0280398 A1 | 11/2012 | Clevenger et al. |
| 2012/0315751 A1 | 12/2012 | Usami |
| 2013/0292835 A1 | 11/2013 | King et al. |
| 2014/0191401 A1 | 7/2014 | Fischer |
| 2015/0332954 A1 | 11/2015 | Ting et al. |
| 2016/0118335 A1 | 4/2016 | Lee et al. |
| 2017/0221827 A1* | 8/2017 | Wu ..................... H01L 21/7682 |

OTHER PUBLICATIONS

Harada et al., Manufacturable Low Keff (<Keff 2.5) Cu Interconnects by Selective Low Damage Air Gap Formation.

Harada et al., Extremely Low Keff (1.9) Cu Interconnects with Air Gap Formed Using SiOC.

* cited by examiner

FORMING AIR GAP

BACKGROUND

Technical Field

The present disclosure relates to semiconductor devices, and more specifically, to methods of forming an air gap in a dielectric at an interconnect level preferably using extreme ultraviolet light (EUV) or electron beam, and the semiconductor device so formed.

Related Art

Current semiconductor devices are being formed having interconnect pitches of less than 48 nanometers (nm) with conductive line widths of less than 25 nm. The pitch is the spacing between adjacent conductive interconnects plus the width of one of the conductive interconnects. In order to continue miniaturization of semiconductor devices and maintain or improve performance, alternative material and integration methods are required. One challenge with current semiconductor device technology nodes is controlling off-state capacitance (Cuff) which indicates the amount cross-talk or noise that may occur within the system, i.e., the amount transmitted signals on one circuit creates an undesired effect on another circuit. Ideally, the off-state capacitance is minimized to reduce undesired digital noise. With current technology at less than 25 nm conductive line widths, obtaining low off-state capacitance while also achieving other targets, such as metal fill expectations, is extremely challenging.

One approach to address the above challenges is to employ air gaps to improve the dielectric constant of back-end-of-line interconnect layers. Current air gap approaches, however, cannot be employed at advanced technology nodes, e.g., with wiring of less than 10 nanometers, because the initial opening required to form the air gap cannot be patterned accurately using current technology. For example, with pitches of 25-35 nm and 15-20 nm spacing between conductive interconnects, the air gap needs to be no wider than the spacing, which requires the opening for the air gap to be 5-10 nm. Formation of such small openings with current photolithography processes, e.g., using 193 nm light, is not possible due to overlay limitations of the air gap structures with respect to the interconnects. Further, use of techniques that damage the dielectric layer or use aggressive etching techniques cannot be employed because they damage conductive interconnect structure.

SUMMARY

A first aspect of the disclosure is directed to a method of forming an air gap for a semiconductor device, the method comprising forming an air gap mask layer over a dielectric interconnect layer, the dielectric interconnect layer including a dielectric layer having a conductive interconnect therein and a cap layer over the dielectric layer; patterning the air gap mask layer preferably using extreme ultraviolet (EUV) light and etching to form an air gap mask including an opening in the cap layer exposing a portion of the dielectric layer of the dielectric interconnect layer adjacent to the conductive interconnect; removing the air gap mask; etching an air gap space adjacent to the conductive interconnect within the dielectric layer of the dielectric interconnect layer using the opening in the cap layer; and forming an air gap in the dielectric interconnect layer by depositing an air gap capping layer to seal the air gap space.

A second aspect of the disclosure provides a semiconductor device, comprising: an interconnect layer over a device layer, wherein the interconnect layer includes: a first low dielectric constant (low-K) dielectric layer under a high etch selectivity dielectric layer, and a pair of immediately adjacent conductive interconnects; and a plurality air gaps located between the pair of conductive interconnects.

A third aspect of the disclosure includes a semiconductor device, comprising: a plurality of dielectric interconnect layers over a device layer, wherein a first dielectric interconnect layer includes a low dielectric constant (low-K) dielectric layer under a high etch selectivity dielectric layer and a conductive interconnect having a width less than approximately 10 nanometers within the first dielectric interconnect layer, the high etch selectivity dielectric layer having an etch selectivity to the low-K dielectric layer between 15:1 and 30:1; and an air gap in the first dielectric interconnect layer, the air gap having a width of no greater than approximately 15 nanometers within the high etch selectivity dielectric layer.

A fourth aspect of the disclosure relates to a semiconductor device, comprising: a plurality of interconnect layers over a device layer, each interconnect layer including at least one conductive interconnect having a width less than approximately 10 nanometers (nm); and an air gap in at least one of the plurality of interconnect layers, the air gap having a width of no greater than approximately 15 nm in a direction perpendicular to the at least one conductive interconnect.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to methods of forming an air gap using extreme ultraviolet (EUV) light and a semiconductor device including the air gap. As understood, the air gap acts to reduce off-state capacitance in a dielectric interconnect layer. The dielectric interconnect layer in which the teachings of the disclosure are employed may include any back-end-of-line (BEOL) layer. As understood, BEOL layers may include any interconnect layer formed on the semiconductor wafer in the course of semiconductor device manufacturing following first metallization. According to embodiments of the disclosure, the dielectric interconnect layer may include a high etch selectivity dielectric layer such as a silicon nitride with hydrogen component (SiNH) upper layer. A majority of a conductive interconnect's height may be embedded within the high etch selectivity dielectric layer. Use of the high etch selectivity dielectric layer and EUV light allows formation of an air gap for advanced technology nodes, e.g., 10 nanometer (nm) line widths and beyond. An air gap according to the various embodiments of the disclosure provides a mechanism to reduce off-state capacitance of any device using it at advanced technology nodes by controlling one of the main contributors of intrinsic FET capacitance: the effective dielectric constant of dielectric interconnect layers. The teachings of the disclosure may be employed with any form of semiconductor device, and any form of substrate (bulk or semiconductor-on-insulator (SOI)).

Figure 1:
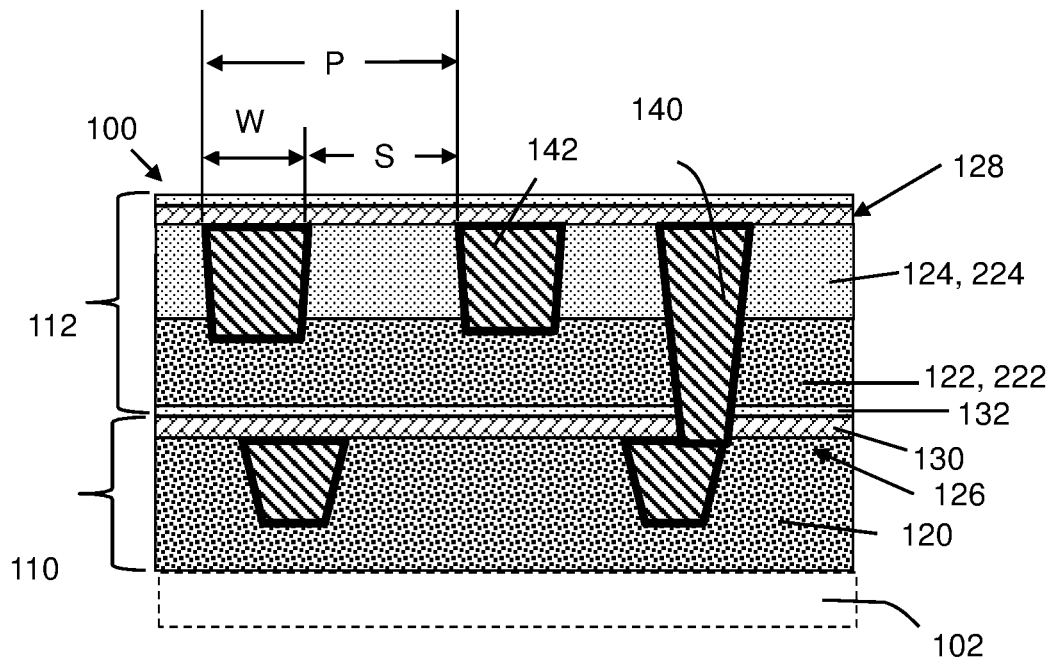
FIGS. 1-6 show cross-sectional views of embodiments of a method according to the disclosure, with FIG. 6 showing a semiconductor device according to embodiments of the disclosure.

Referring to FIG. 1, a cross-sectional view of preliminary processes of a method of forming an air gap for a semiconductor device according to embodiments of the disclosure is illustrated. FIG. 1 shows a semiconductor device 100 after formation of a device layer 102 (shown in phantom) and a number of dielectric interconnect layers 110, 112 thereover, an upper one of which will have an air gap according to embodiments of the disclosure formed therein. Device layer 102 may include any form of substrate and may include any form of active semiconductor device, e.g., transistor, capacitor, resistor, etc., to which conductive interconnects are made.

Dielectric interconnect layers 110, 112, as described herein, may include a number of layers including a first interconnect layer 110 and second interconnect layer 112. Each interconnect layer 110 that does not include an air gap according to embodiments of the disclosure may include any conventional interlayer dielectric (ILD) layer 120. ILD layer 120 may include but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phosphosilicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. In contrast, in one embodiment, each dielectric interconnect layer 112 that is to include an air gap according to embodiments of the disclosure includes a low dielectric constant (low-K) ILD layer 122, 222 (hereinafter "low-K dielectric layer 122, 222") similar to those materials listed for ILD layer 120, and may include a high etch selectivity dielectric layer 124, 224 having an etch selectivity to low-K dielectric layer 122, 222 in the range between 15:1 and 30:1, for example, using a diluted hydrofluoric acid solution 100:1 to 1000:1. In one embodiment, dielectric layer 124 may include a silicon nitride with hydrogen component (SiNH) layer 124. SiNH layer 124 may include any silicon nitride material with a hydrogen component having an etch selectivity to low-K dielectric layer 122 in the range between 15:1 and 30:1, e.g., using a diluted hydrofluoric acid solution 100:1 to 1000:1. In alternative embodiments, each dielectric interconnect layer 112 that is to include an air gap according to embodiments of the disclosure includes a low-K dielectric layer 222 similar to those materials listed for ILD layer 120 and low-K dielectric layer 122, and high etch selectivity dielectric layer 224 that is not SiNH, but has an etch selectivity to low-K dielectric layer 222 in the range between 15:1 and 30:1. In this fashion, whatever etch chemistry is used, the etching etches high etch selectivity dielectric layer 124, 224 laterally to, e.g., approximately half the minimum pitch while not etching low-K dielectric layer 122, 222. Low-K dielectric layer 122, 222 can also be selected to ensure this etch selectivity. In any event, each dielectric interconnect layer 110, 112 may also include a respective cap layer 126, 128 at an upper surface thereof. Each cap layer 126, 128 may include one or more layers, for example, a silicon oxide layer 130 and a silicon nitride etch stop layer 132. As understood, various other forms of cap layers may also be employed. Further, it is emphasized that while cap layers 126, 128 are illustrated as identical, they can be different materials, thicknesses, etc.

Dielectric interconnect layers 110, 112 each include a number of conductive interconnects 140, 142. As used herein, "conductive interconnects" may include any form of electrically conductive elements such as but not limited to contacts 140 and wires 142. More particularly and as illustrated, in one example, a number of contacts 140 may extend vertically through selected dielectric interconnect layers such as dielectric interconnect layer 112 and/or dielectric interconnect layer 110 (partially shown) to various parts of other dielectric interconnect layers. Further, a number of wires 142 may extend in selected dielectric interconnect layers 110, 112. Typically, contacts 140 extend mostly vertically within semiconductor device 100 to connect conductors in layers thereof, i.e., vertically on page as illustrated. In contrast to contacts 140, wires 142 extend mostly horizontally or laterally in a layer within semiconductor device 100 to connect contacts therein, i.e., into, out of or across a page as illustrated. As understood, each conductive interconnect 140, 142 includes a conductor such as aluminum or copper, within a refractory metal liner such as titanium or titanium nitride for aluminum, or tantalum or tantalum nitride for copper. Other liners may include, for example, cobalt (Co), ruthenium (Ru), manganese (Mn), tungsten (W), iridium (Jr), rhodium (Rh) and platinum (Pt), etc., or mixtures of any liner material stated herein, may also be employed. Semiconductor device 100 as illustrated in FIG. 1 can be formed using any now known or later developed semiconductor fabrication techniques, e.g., material deposition, photolithographic patterning and etching, doping, etc. As illustrated, each conductive interconnect is formed using damascene processing, but dual damascene processing may also be employed.

Conductive interconnects 140, 142, according to embodiments of the disclosure, have dimensions commensurate with advanced technology nodes. In one example, line widths W are at less than approximately 10 nm, and pitches P are at less than approximately 25 nanometers (nm). As space width S between adjacent conductive interconnects 140 or 142 can be less than approximately 15 nm, the pitch P can be less than approximately 25 nm. Also, in accordance with one embodiment of the disclosure, at least 50% of a height of wire 142 may be within high etch selectivity dielectric layer 124, 224, i.e., from top surface to lower surface of wire 142.

"Depositing" or "deposition," as used herein, may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
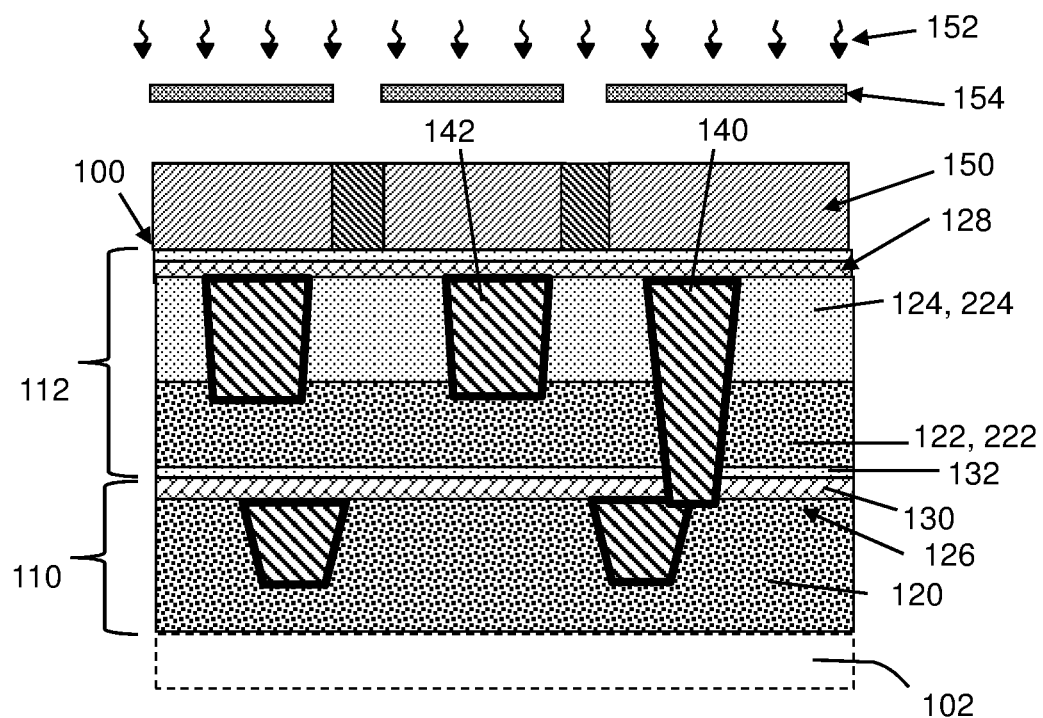

FIG. 2 shows forming an air gap mask layer 150 over dielectric interconnect layer 112. FIG. 2 also shows patterning air gap mask layer 150 using extreme ultraviolet (EUV) light 152, e.g., using any now known or later developed reticle 154 appropriate for EUV light 152. As used herein, EUV light includes light having a frequency less than 100 nanometers. Current semiconductor processes use light of typically 193 nm, which is ultraviolet. Air gap mask layer 150 may be formed, for example, post planarization of dielectric interconnect layer 112, e.g., via chemical mechanical polishing (CMP), and may include any now known or later developed masking material appropriate for use with EUV light.

Figure 3:
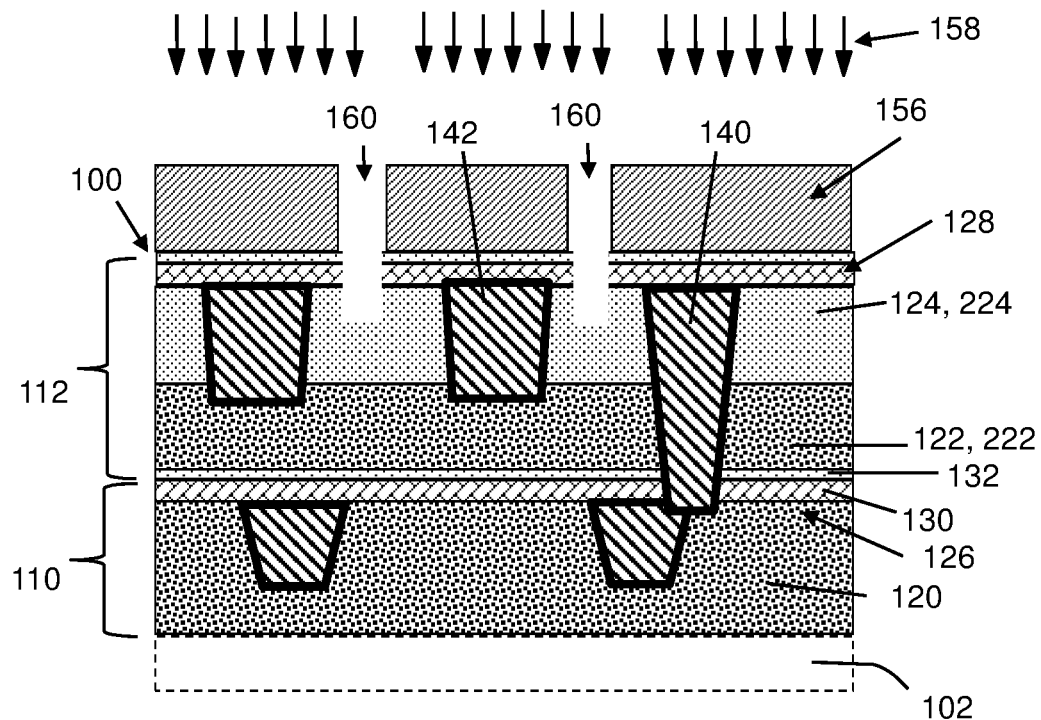

FIG. 3 shows etching 158 to form an air gap mask 156 including etching an opening 160 in cap layer 128 exposing a portion of dielectric layer(s) (124, 224 and/or 122, 222) of dielectric interconnect layer 112 adjacent to the conductive interconnect 140 or 142. In the embodiment shown, etching 158 forms air gap mask 156 including opening 160 in cap layer 128 exposing the portion of the dielectric layer of dielectric interconnect layer 112. Etching 158 may also remove a portion of high etch selectivity dielectric layer 124, 224. That is, in the example shown, SiNH layer 124 or dielectric layer 224 is exposed. While only high etch selectivity dielectric layer 124, 224 is shown exposed, in other embodiments, opening 160 may extend to or into low-K dielectric layer 122, 222. At this time, opening 160, however, does not expose or contact conductive interconnects 140, 142. Due to the use of EUV light 152 (FIG. 2), openings 160 in air gap mask 156 and cap layer 128 may have width of less than approximately 10 nm, and could be approximately 5 nm. The small widths are unattainable using conventional photolithography processing, i.e., using ultraviolet light. It is understood that while only a couple openings 160 are shown in FIG. 5, any number may be formed into or out of the page between adjacent conductive interconnects 140, 142.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) an-isotopically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In FIG. 3, etching 158 may include, for example, RIE using standard process gasses including compounds of carbon, fluorine, oxygen, etc.

Figure 4:
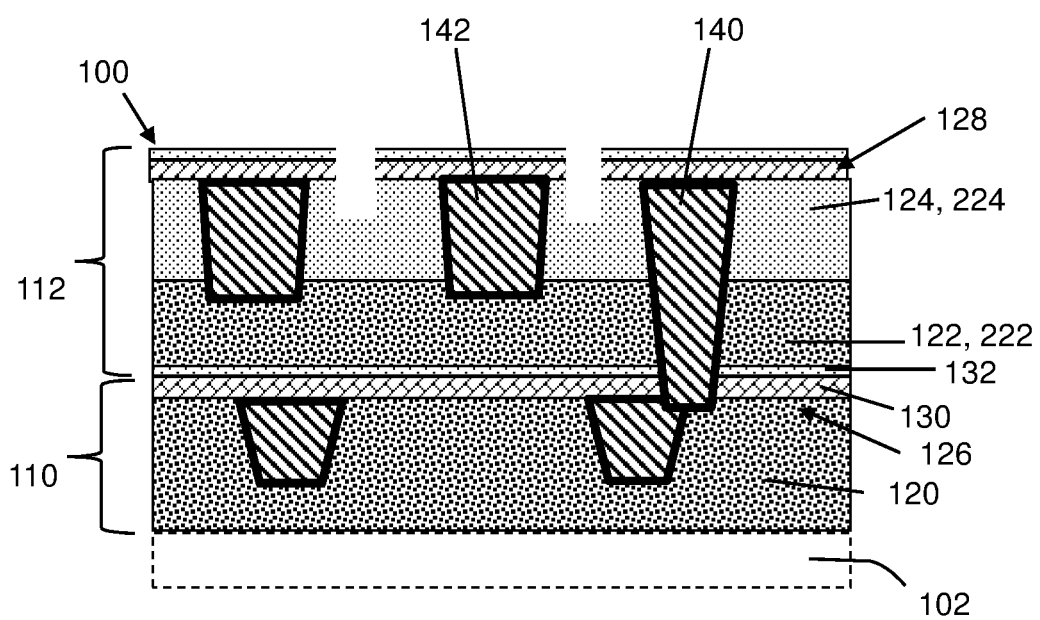

FIG. 4 shows removing air gap mask 156 (FIG. 3), which can be completed using any now known or later developed resist strip, in-situ or ex-situ.

Figure 5:
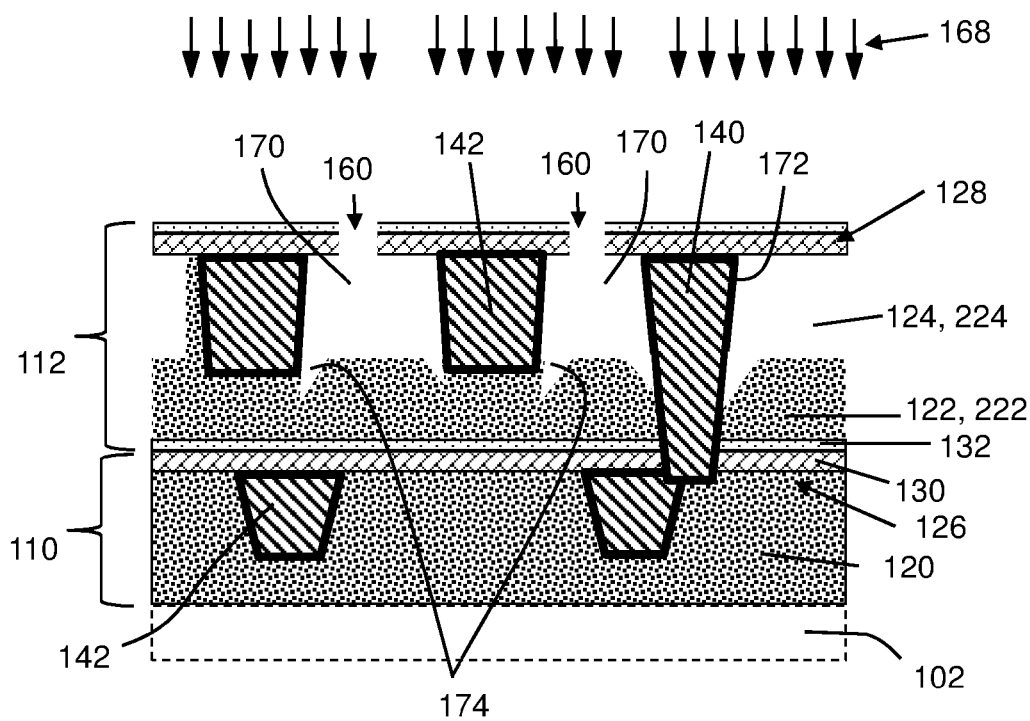

FIG. 5 shows etching 168 an air gap space 170 adjacent to conductive interconnect 140 and/or 142 within the dielectric layer of dielectric interconnect layer 112 using opening 160 in cap layer 128. In this process, etching 168 may include a wet etch, which may include, for example, use of diluted hydrofluoric acid (DHF) (with water). In one example, the DHF may be highly diluted, e.g., 100:1 to 1000:1. In this regard, high etch selectivity dielectric layer 124, 224, e.g., SiNH, has been employed to provide a quicker etch rate compared to low-K dielectric layer 122. As noted, any high etch selectivity dielectric layer 124, 224 would have an etch selectivity to low-K dielectric layer 122, 222 in the range between 15:1 and 30:1. In this fashion, whatever etch chemistry is used, the etching etches high etch selectivity dielectric layer 124, 224 laterally to, e.g., approximately half the minimum pitch while not etching low-K dielectric layer 122, 222.

As illustrated, as a result, etching 168 may remove high etch selectivity layer 124, 224 over low-K dielectric layer 122, 224 adjacent to conductive interconnect 140 and/or 142. In the example shown, removing high etch selectivity dielectric layer 124, 224 over low-K dielectric layer 122, 222 includes exposing a liner layer 172 (thick black line) of conductive interconnect(s) 140 and/or 142. As understood, it is also possible to retain some of high etch selectivity dielectric layer 124, 224 by stopping etching 168 prior to exposing conductive interconnects 140 and/or 142 (see far left side of FIG. 5). As also understood, among other things, spacing S (FIG. 1) between conductive interconnects 140, 142 and/or the width of opening 160 may also dictate the size of air gap space 170 and the extent to which liner 172 of conductive interconnects 140, 142 is exposed. Depending on the wet etch process and duration used, etching 168 may also damage a portion 174 of low-K dielectric layer 122, 222. Damaged portion 174 may manifest itself in a number of ways, but has been illustrated as fangs that extend into low-K dielectric layer 122, 222 adjacent conductive interconnects 140 and/or 142. In any event, control of etching 168 can control formation of air gap space 170.

Figure 6:
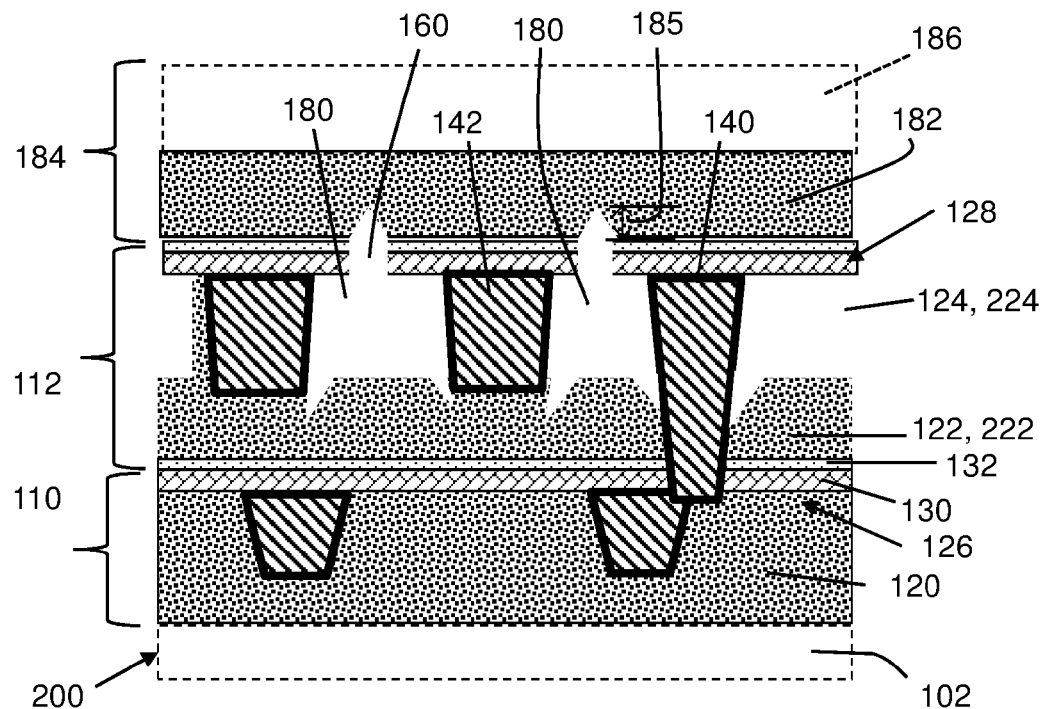

FIG. 6 shows forming an air gap 180 in dielectric interconnect layer 112 by depositing an air gap capping layer 182 to seal air gap space 170 (FIG. 5). Air gap capping layer 182 may be deposited using any method described herein, and may include any dielectric, e.g., one of the ILD materials listed herein, capable of closing opening 160. Edges of cap layer 128 at opening 160 act to pinch opening 160 to assist in closing air gap 180. Where dielectric interconnect layer 112 is a penultimate layer of the semiconductor device, capping layer 182 may provide a last dielectric layer of the device. Otherwise, air gap capping layer 182 may form at least a portion of a dielectric layer 184 of a subsequent dielectric interconnect layer (of which layer 182 forms at least part thereof). In this case, where the subsequent dielectric interconnect layer is to include an air gap 180, dielectric layer 184 may include air gap capping layer 182 in the form of a low dielectric constant (low-K) dielectric layer under a high etch selectivity dielectric layer 186 (e.g., SiNH or other dielectric layer having etching characteristics as described herein) (shown in phantom). Processing to form an air gap may then proceed as otherwise described herein to form air gaps in dielectric layer 184. Where the subsequent dielectric interconnect layer will not include an air gap 180, high etch selectivity dielectric layer 186 may be omitted and conventional ILD materials can be employed.

FIG. 6 also shows embodiments of a semiconductor device 200 after processing according to methods of the disclosure. Semiconductor device 200 may include a plurality of dielectric interconnect layers 110, 112, 184 over device layer 102. One or more dielectric interconnect layers, e.g., layer 112, may include low-K dielectric layer 122 under high etch selectivity dielectric layer 124, 224 (e.g., SiNH or other dielectric layer having etching characteristics as described herein) and a conductive interconnect 140, 142 having width less than approximately 10 nm within first dielectric interconnect layer 112. In any event, high etch selectivity dielectric layer 124, 224 has an etch selectivity to low-K dielectric layer 122, 222 in the range between 15:1 and 30:1. In this fashion, whatever etch chemistry is used, the etching etches high etch selectivity dielectric layer 124, 224 laterally to, e.g., approximately half the minimum pitch while not etching low-K dielectric layer 122, 222. Semiconductor device 200 may also include air gap 180 in first dielectric interconnect layer 112. As noted, air gap 180 may have a width of no greater than approximately 15 nm within high etch selectivity dielectric layer 124, 224, i.e., between pair of conductive interconnects 140, 142 or 140 and 142 in a direction perpendicular to the conductive interconnects. Cap layer 128 over dielectric interconnect layer 124 includes opening 160 which may form part of air gap 180 in first dielectric interconnect layer 112, i.e., where capping layer 128 was removed and dielectric layer 182 does not fill it. As noted, opening 160 may have a width of no greater than approximately 10 nm. Another dielectric interconnect layer 184 over dielectric interconnect layer 112 may include a low-K dielectric layer 182 that seals opening 160 of the air gap. After sealing, a pinch-off height 185 may exist in air gap 180. Pinch-off height 185 is defined as that part of air gap 180 that extends above cap layer 128 (or above whatever material the opening 160 is in). Pinch-off height 185 may be from 0 to approximately 6 nm and ranges therebetween, e.g., less than approximately 6 nm. Or, viewed another way, pinch-off height 185 may be less than 20% of low-K dielectric layer 182 thickness. This relatively low pinch-off height 185 allows upper level air gaps to be placed directly on top of the current level air gap. Likewise, the low pinch-off height 185 also allows vias immediately above the current level to be placed close to air gap opening 160. Therefore, there are more degrees of freedom with via placement designs using techniques of this disclosure. With some embodiments of semiconductor device 200, at least 50% of a height of the conductive interconnect 140 and/or 142 may be within high etch selectivity dielectric layer 124, 224. This height arrangement is in contrast to conventional air gap structures. The larger volume of the air gap and positioning thereof results in a larger capacitance reduction benefit. Further, the thicknesses of high etch selectivity dielectric layer 124, 224 and low-K dielectric layer 182 as described herein that allows for the air gap positioning are different than conventional processes.

Figure 7:
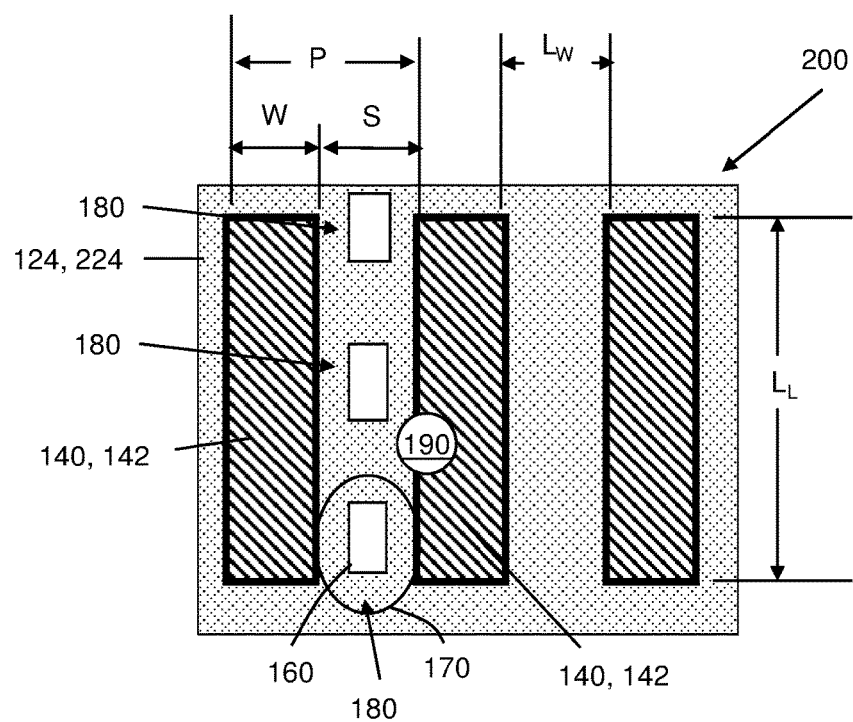
FIG. 7 shows a plan view of embodiments of an air gap according to embodiments of a method according to the disclosure.

FIG. 7 shows a plan view of an illustrative semiconductor device 200 including a plurality of air gaps 180 formed according to embodiments of the disclosure without capping layer present. As illustrated, more than one air gap 180 may be provided between conductive interconnects 140, 142, or in other words, air gap 180 may be segmented. That is, semiconductor device 200 may include pair of immediately adjacent conductive interconnects 140, 142 or 140 and 142, and a plurality air gaps 180 located between the pair of conductive interconnects. The oval under opening 160 illustrates the position of air gap space 170. Thus, one can imagine in FIG. 7 that there exists three air gaps 180 having air gap spaces 170 associated with each of openings 160. Conversely, etching 168 (FIG. 5) may have been long enough for the given proximity of openings 160 such that one continuous air gap 180 exists (see FIG. 6). In one example, advanced ground rule interconnects may have a pitch P (line width W plus spacing S) of approximately 50 nm or smaller, e.g., 25 nm as noted for one embodiment herein. An inter-conductive interconnect area may be denoted by length $L_L$ and width $L_W$. EUV defined opening 160 may have a width $W_o$ (left-to-right on page) that is approximately 20-50% of inter-conductive interconnect area width $L_W$, and a length $L_o$ (up-down on page) that is 1.5 to 4 times width $W_o$. The optimal value of air gap 180 size will be determined by SiNH layer 124 (or other dielectric layer 224) etch rate in the DHF, e.g., with a EUV print at 15 nm, an opening 160 width $W_o$ of 5 nm may be possible. The specific process parameters may be chosen so that resulting air gap 180 will have a width spanning or nearly spanning width $L_W$ between conductive interconnects 140, 142, and a depth of approximately 20-80% of conductive interconnect 140 or 142 height, as determined by the DHF etch rate of high etch selectivity dielectric layer 124, 224. In one example, at the 7 nm technology node, with a pattern overlay of 3 sigma, <7 nm conductive interconnect width and inter-conductive interconnect width $L_W$ of 20 nm: air gap space 170 width may range from 4-10 nm, and have a depth of 20-80% of conductive interconnect 140, 142 height. In another embodiment, air gap space 170 may have a width perpendicular to conductive interconnects the same as spacing S, such that air gaps 180 have a width of no greater than approximately 15 nm between the pair of adjacent conductive interconnects. A pitch (spacing) between each pair of plurality of air gaps 180 (up-down page on FIG. 7) may be equal to a width thereof, e.g., approximately 15 nm. These dimensions are preferably obtained through the use of EUV as disclosed herein or e-beam; and are not attainable using currently practiced processes. EUV or e-beam are preferred because they provide the ability to make small openings which can be positioned with control.

As will be recognized, air gap 180 may be used in a wide variety of semiconductor device 200 applications. Use of air gap 180 at advanced technology nodes according to the various embodiments of the disclosure provides a mechanism to reduce off-state capacitance of any device at those nodes by controlling one of the main contributors of intrinsic FET capacitance: the effective dielectric constant of dielectric interconnect layers 110, 112, 184. In addition, this integration approach offers smaller pinch-off height compared to conventional air gap forming processes, which improves the process window for subsequent metal layer (Mx+1) module builds, e.g., with dielectric planarization. As seen in FIG. 7, now an immediately upper level via 190 can be placed on a wire 142 which has an air gap 180 in its adjacent dielectric. In the past, due to overlay concerns and non-segmentation of air gap 180, design rules may forbid such via placement. Thus, with reduced air gap opening size, increased air gap volume and with smaller gap pinch off height, embodiments of the disclosure enable next level via density design rules comparable to that of integration schemes without airgaps. That is, with judicious placement of airgaps 180, vias can be placed at the same spacing as vias in an airgap-free interconnect, which means vias can be 1-pitched spaced, i.e., one width apart.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an air gap for a semiconductor device, the method comprising:
    forming an air gap mask layer over a dielectric interconnect layer, the dielectric interconnect layer including a dielectric layer having a conductive interconnect therein and a cap layer over the dielectric layer, wherein the dielectric layer of the dielectric interconnect layer includes a first dielectric layer and a silicon nitride with hydrogen component (SiNH) layer over the first dielectric layer;
    patterning the air gap mask layer using extreme ultraviolet (EUV) light and etching to form an air gap mask including an opening in the cap layer exposing a portion of the dielectric layer of the dielectric interconnect layer adjacent to the conductive interconnect;
    removing the air gap mask;
    etching an air gap space adjacent to the conductive interconnect within the dielectric layer of the dielectric interconnect layer using the opening in the cap layer; and
    forming an air gap in the dielectric interconnect layer by depositing an air gap capping layer to seal the air gap space.

2. The method of claim 1, wherein etching to form the air gap mask including the opening in the cap layer exposing the portion of the dielectric layer of the dielectric interconnect layer includes removing a portion of the high etch selectivity dielectric layer.

3. The method of claim 2, wherein etching the air gap space adjacent to the conductive interconnect within the dielectric layer of the dielectric interconnect layer using the opening in the cap layer includes removing the high etch selectivity dielectric layer from over the low-K dielectric layer adjacent to the conductive interconnect.

4. The method of claim 3, wherein etching the air gap space adjacent to the conductive interconnect within the dielectric layer of the dielectric interconnect layer using the opening in the cap layer and removing the high etch selectivity dielectric layer from over the first dielectric layer adjacent to the conductive interconnect includes damaging a portion of the first dielectric layer.

5. The method of claim 3, wherein etching the air gap space adjacent to the conductive interconnect within the dielectric layer of the dielectric interconnect layer using the opening in the cap layer and removing the high etch selectivity dielectric layer from over the low-K dielectric layer adjacent to the conductive interconnect includes exposing a liner layer of the conductive interconnect.

6. The method of claim 1, wherein the conductive interconnect includes a wire, and at least 50% of a height of the wire is within the dielectric layer of the dielectric interconnect layer.

7. The method of claim 1, wherein the opening in the cap layer exposing the portion of the dielectric layer of the dielectric interconnect layer adjacent to the conductive interconnect has a width of no greater than approximately 10 nanometers.

8. The method of claim 1, wherein a width of the conductive interconnect is less than approximately 10 nanometers.

9. The method of claim 1, wherein a spacing between the conductive interconnect and an adjacent conductive interconnect is less than approximately 15 nanometers.

10. The method of claim 1, wherein depositing the air gap capping layer to seal the air gap space includes forming a subsequent dielectric layer of a subsequent dielectric interconnect layer, the subsequent dielectric layer of the subsequent dielectric interconnect layer including a low dielectric constant (low-K) dielectric layer under and a silicon nitride with hydrogen component (SiNH) layer.

11. A method of forming an air gap for a semiconductor device, the method comprising:
   forming an air gap mask layer over a dielectric interconnect layer, the dielectric interconnect layer including a dielectric layer having a conductive interconnect therein and a cap layer over the dielectric layer;
   exposing a portion of the dielectric layer of the dielectric interconnect layer adjacent to the conductive using extreme ultraviolet (EUV) light and etching to form at least one opening in the cap layer;
   removing the air gap mask layer;
   selectively etching the exposed portion of the dielectric layer of the dielectric interconnect layer using the at least one opening in the cap layer, to form at least one air gap space adjacent to the conductive interconnect; and
   forming an air gap capping layer over the at least one opening in the cap layer of the dielectric interconnect layer to seal the air gap space, wherein forming the air gap capping layer to seal the air gap space includes forming a dielectric layer of a subsequent dielectric interconnect layer, the dielectric layer of the subsequent dielectric interconnect layer including a low dielectric constant (low-K) dielectric layer under and a silicon nitride with hydrogen component (SiNH) layer.

12. The method of claim 11, wherein the conductive interconnect includes a wire, and at least 50% of a height of the wire is within the dielectric interconnect layer.

13. The method of claim 11, wherein the at least one opening in the cap layer exposing the portion of the dielectric layer of the dielectric interconnect layer adjacent to the conductive interconnect has a width of no greater than approximately 10 nanometers.

14. The method of claim 11, wherein a width of the conductive interconnect is less than approximately 10 nanometers.

15. The method of claim 11, wherein a spacing between the conductive interconnect and an adjacent conductive interconnect is less than approximately 15 nanometers.

16. A method of forming an air gap for a semiconductor device, the method comprising:
   forming an air gap mask layer over a dielectric interconnect layer, the interconnect layer including:
      a low dielectric constant (low-K) dielectric layer,
      a dielectric layer having a conductive interconnect therein, and positioned on the low-K dielectric layer, the dielectric layer including silicon nitride with a hydrogen component (SiNH), and
      a cap layer over the dielectric layer;
   exposing a portion of the dielectric layer of the dielectric interconnect layer adjacent to the conductive using extreme ultraviolet (EUV) light and etching to form at least one opening in the cap layer;
   removing the air gap mask layer;
   selectively etching the exposed portion of the dielectric layer of the dielectric interconnect layer using the at least one opening in the cap layer, to form at least one air gap space adjacent to the conductive interconnect; and
   forming an air gap capping layer over the at least one opening in the cap layer of the dielectric interconnect layer to seal the air gap space.

17. The method of claim 16, wherein selectively etching the exposed portion of the dielectric layer includes removing a portion of the high etch selectivity dielectric layer from over the low-K dielectric layer adjacent to the conductive interconnect.

18. The method of claim 17, wherein selectively etching the exposed portion of the dielectric layer further includes removing a portion of the low-K dielectric layer.

* * * * *